(12) United States Patent
Mimlitch, III et al.

(10) Patent No.: US 6,230,541 B1
(45) Date of Patent: May 15, 2001

(54) CARDCAGE FOR CIRCUIT CARDS

(75) Inventors: Robert H. Mimlitch, III, Rowlett; Robert A. Bruce, Greenville, both of TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/396,980

(22) Filed: Sep. 15, 1999

Related U.S. Application Data

(62) Division of application No. 09/098,040, filed on Jun. 16, 1998, now abandoned.

(51) Int. Cl.[7] .................................................. B21D 31/00
(52) U.S. Cl. .............................. 72/379.2; 72/333; 72/335
(58) Field of Search .............................. 72/332, 333, 334, 72/335, 324, 337, 379.2; 29/897, 897.15

(56) References Cited

U.S. PATENT DOCUMENTS

| | | | |
|---|---|---|---|
| 4,150,556 | * | 4/1979 | Melnyk ................................... 72/333 |
| 4,566,865 | * | 1/1986 | Nishitsuji et al. ................... 417/363 |
| 4,702,154 | | 10/1987 | Dodson . |
| 5,006,959 | | 4/1991 | Freige et al. . |
| 5,456,099 | * | 10/1995 | Lipari ..................................... 72/131 |
| 5,473,507 | | 12/1995 | Schwegler et al. . |
| 5,576,931 | | 11/1996 | Crane, Jr. et al. . |
| 5,791,186 | * | 8/1998 | Nishida et al. ........................ 72/337 |

OTHER PUBLICATIONS

CAPSTONE Electronics brochure entitled: "AUGAT® VME Packaging."
Carlo Gavazzi, Inc. brochure entitled: "System Packaging Products."
Electronic Solutions 1992 Catalog enetitled: "System Packaging."
MATRIX Rugged Technology brochure entitled: "Battling Harsh Environments," 1995 VMEbus Catalog.
Schroff® 1987/1988 Catalog entitled: "Electronic Enclosures Microprocessor Packaging Systems."
VECTOR Electronic Company brochure entitled: "System Packaging & Prototype Products."
VERO Electronics 1997 Handbook.
Brochure entitled: "Introducing FAB–RAK™ The Fabricated Steel CompactPCI™ Subrack that Cuts Costs without Tradeoffs," Carlo Gavazzi, Inc.
FAB–RAK from the Internet at: http://www.gavazzi–mupac.com/fabrak.htm.
Co–pending U.S. Patent application Ser. No. 09/097,892 filed Jun. 16, 1998 (ESYS:007).

* cited by examiner

*Primary Examiner*—Ed Tolan
(74) *Attorney, Agent, or Firm*—Baker Botts L.L.P.

(57) ABSTRACT

The present invention provides an improved cardcage design. The improvements result from the formation of an integral cardcage side using a construction method involving precision punched sheet aluminum that is precision formed into final configuration. The integral cardcage side design provides ease of assembly for the cardcage while enhancing structural integrity, improves the alignment of circuit cards within the cardcage to the backplane, increases the airflow channels between the card guides, and adapts to incorporate additional features for airflow control. The manufacturability of the cardcage is greatly simplified by reducing the number of parts requiring assembly and by the use of simple and inexpensive tools and assembly techniques.

18 Claims, 16 Drawing Sheets

CARDCAGE FOR CIRCUIT CARDS

This is a divisional of application Ser. No. 09/098,040 filed Jun. 16, 1998 now abandoned.

FIELD OF THE INVENTION

The present invention relates generally to cardcages. More particularly, the invention relates to an improved cardcage that increases flexibility, improves structural integrity, provides ease of insertion of circuit cards, reduces cost, and enhances airflow across circuit cards.

BACKGROUND OF THE INVENTION

Electronic components and integrated circuit packages are often mounted on printed circuit cards creating an electronic assembly of irregularly shaped packages bonded on a planer surface. Multiple circuit cards may be placed into an array (referred to as a "cardcage") within an electronic enclosure thereby maximizing the packaging volume efficiency. Several types and configurations of electronic enclosures with the ability to support various numbers of circuit cards are readily available for connecting the circuit cards into a cardcage. Standard bus architectures have been defined for these cardcages. For example, the VME bus standard (ANSI/IEEE Std. 1014-1987) has been defined for the backplane bus interface for cardcages. Other bus standards include the VME64 Standard, which revises the VME bus standard into a 64-bit architecture, and the VXI ("VME eXtensions for Instrumentation") bus, which is designed to allow low level signals to co-exist on a backplane with high speed digital and RF or microwave signals.

Currently available cardcages have significant complexity due to the number of components and fasteners used for assembly. These cardcages have typically been manufactured using four or five extruded metal rails and sheets, often aluminum, stamped and formed to the shape required to build the cardcage. The extruded rail design requires a pair of rails located at the inlet and exit of the cardcage. These rail extrusions are machined to length, which requires extreme precision to ensure accuracy. The sheets and rails are connected to each other by a suitable means, including rivets, screws, welds, or glue. A card guide is connected between each pair of rails for receiving a circuit card assembly into the cardcage. Both entrance and exit rails must be exact mirror images to ensure proper alignment of the card guides. The card guides are installed by snapping a plastic tab into an oval type slot in the extrusion. The card guides are usually mounted to the extrusion, through a mechanical means, such as screws, for holding them in place. The slots in the rail extrusions, which are used to locate the guides, are typically on 0.20" centers. This spacing requires any card pitch changes (i.e., changes in the card spacing), to be limited to 0.20" increments.

Next, a floating nutrail is slid into each extrusion to provide a means of attaching the associated cards and backplanes. Insulating strips must then be positioned between the backplane and the mounting surfaces prior to backplane attachment.

It has been recognized that this assembly process may be costly and time consuming due to the number of parts and connectors that must be used to connect the components and the complexity involved in aligning the various components. In particular, currently available cardcages require careful alignment of an associated backplane to ensure proper mating of the circuit cards with the backplane. In addition, the cardcage rail extrusion design requires significant tooling costs to produce the intricate features used to ensure proper alignment.

It has also been recognized that an extruded rail design may be deformed when placed under a moderate mechanical loading. The final cardcage assembly of an extruded rail design has a reduced structural integrity due to the number of parts and fastener locations that produce stress concentrations. Therefore, currently available cardcages are susceptible to deflection from a rectangular shape when forces are applied to the sides of the cardcage.

In addition, an extruded rail design does not lend itself to moderate changes or modifications due to the nature of the cardcage design. There is typically one mounting hole on each end of the extruded rails for attachment to the cardcage ends. These mounting holes are located in the extrusion and any change to the mounting holes would require significant tooling costs.

It has further been recognized that cardcages using sheets and extruded metal rails reduce the available airflow through the cardcage due to large obstructions present in the design. Cooling of the circuit cards is further hindered due to restrictive openings and blockage of airflow at the cardcage corners, which results in uneven distribution of air into a cardcage. Cooling of circuit cards in the cardcage is important for proper operation of electronic components on the circuit cards. As circuit cards are being developed with greater electronic component density per card, and electronic components continue to operate at higher frequencies and increased power, the cooling of circuit cards in these electronic enclosures becomes more critical for proper operation of these electronic components. Electronic components that operate above recommended thermal constraints may operate unreliably and cause circuit cards to prematurely fail due to thermal stress. The amount of cooling provided by an airflow source in a cardcage, such as an axial flow fan or a centrifugal blower, is based directly upon the velocity, temperature, and pressure of air provided over the components. If the circuit cardcage hinders airflow from the source due to restrictive openings, then total volumetric airflow is reduced, recirculation loops are created in the cardcage, and low velocity areas occur. As a result, the amount of cooling provided by the airflow source will decrease. Additionally, air that is not distributed evenly into a card slot by the cardcage will not cool all devices on the card evenly and adequately.

It has also been recognized that cardcage designs do not account for the problems associated with the use of multiple fans in front of a cardcage. The use of multiple fans in a cardcage causes significant disturbances in airflow due to the interactions of air from one fan interacting with air from an adjacent fan.

Therefore, there is a need for a cardcage assembly having an integrally formed cardcage side for inlet and exit airflow that reduces the cost and complexity of assembling a cardcage while increasing structural integrity. In addition, a need has arisen for a cardcage in which the cardcage sides inherently align circuit cards to a backplane and are not subject to deflection. An additional need exists for a cardcage assembly that provides for improved cooling within the cardcage and reduced airflow disturbances and/or loses.

SUMMARY OF THE INVENTION

The present invention provides an improved cardcage that enhances cooling, increases flexibility while adding structural rigidity, simplifies construction, and reduces assembly cost. In a broad aspect, the invention comprises a cardcage side for air inlet and exit. The cardcage side is specially designed to enhance airflow and aid in the alignment of the backplane with circuit cards. The unitary cardcage side includes flanges formed from a single metal sheet together with a plurality of generally parallel and laterally spaced card guide attachment locations extending between the flanges. Each flange is adapted to be aligned and fastened to the walls of a cardcage enclosure.

In an embodiment, the card guide attachment locations are configured to receive and secure a non-conductive member built to serve as a card guide. Alternatively, the inward surface of each card guide attachment location may be adapted to serve as a card guide.

In another aspect, the present invention comprises an improved assembly process for a cardcage side. In an embodiment, card guide attachment locations may be integrally formed with the cardcage side by punching or otherwise forming slots along a central portion of a metal sheet. The metal sheet is further bent along one or more lines parallel to the slots and between the last slot and the end of the sheet to create flanges for fastening the sheet to a circuit card enclosure. The improved design simplifies the assembly process and reduces assembly time because the need for components to be fastened using numerous fastening elements is eliminated. Further, no special tools are required to connect the various components. Standard metal punches, drills, brakes, and other readily available tools are adequate to perform the principal manufacturing operations.

In another aspect, the invention provides an improved cardcage that improves airflow through the cardcage side. More particularly, airflow guides may be created integral with the cardcage side for directing, diverting, deflecting, or otherwise distributing the flow of air from an airflow source to improve airflow in the cardcage.

In another aspect, the present invention provides for more accurate alignment of the backplane and the card. In the present invention, tabs are located on the cardcage side, which mate with slots in the end plates to ensure that no alignment is required by the assembler. Since the cardcage side is formed from a single sheet of metal, the tolerances are drastically reduced and provide for a virtually fool proof alignment system. These tabs are used to set the distance between the inlet and exit sides. This dimension allows the cards to slide into the cardcage freely while providing a guide that ensures each card will mate with the backplane.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DESCRIPTION OF ILLUSTRATIVE EMBODIMENTS

Figure 1A:
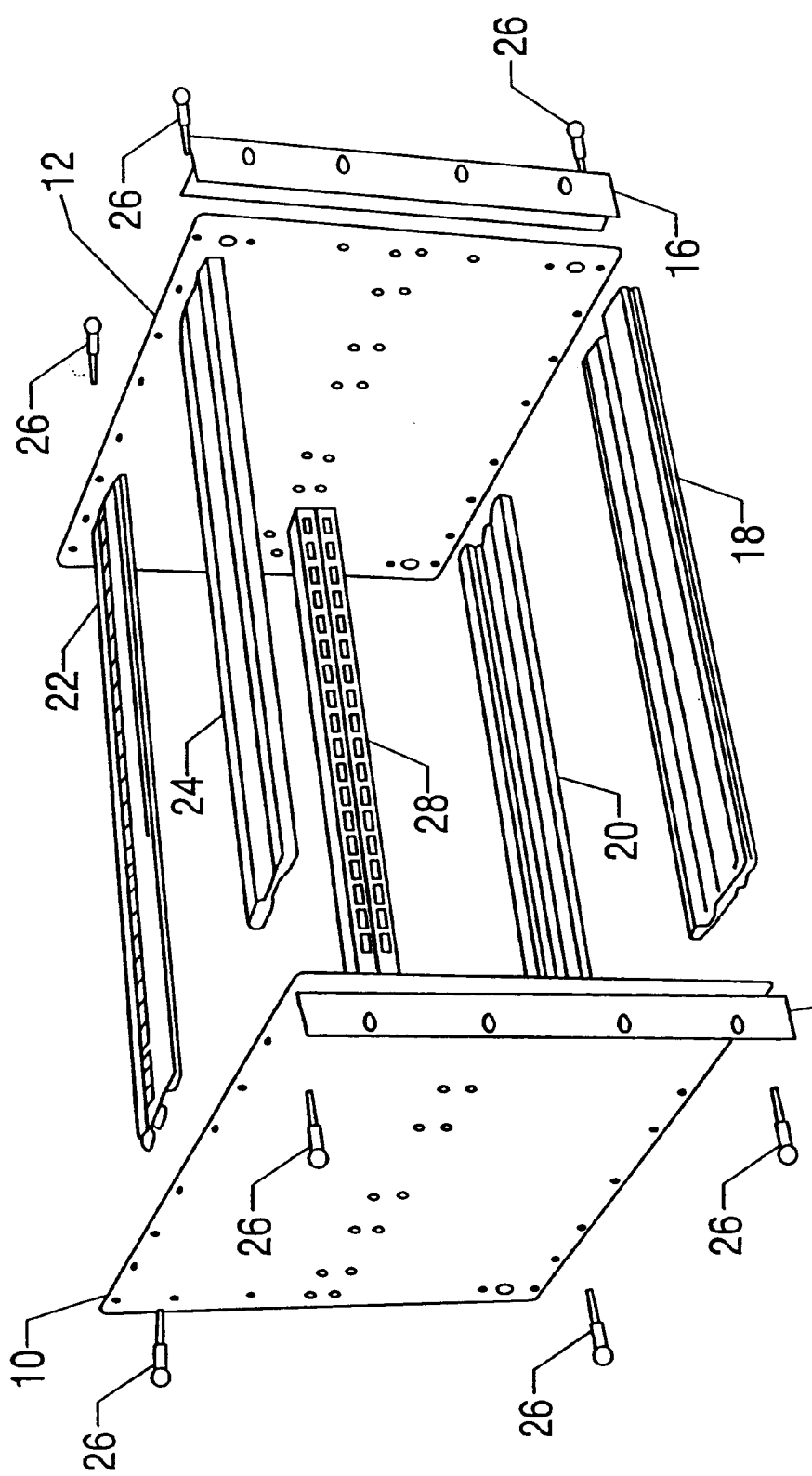
FIG. 1A is an exploded view of a typical cardcage using an extruded rail design.
Figure 1B:
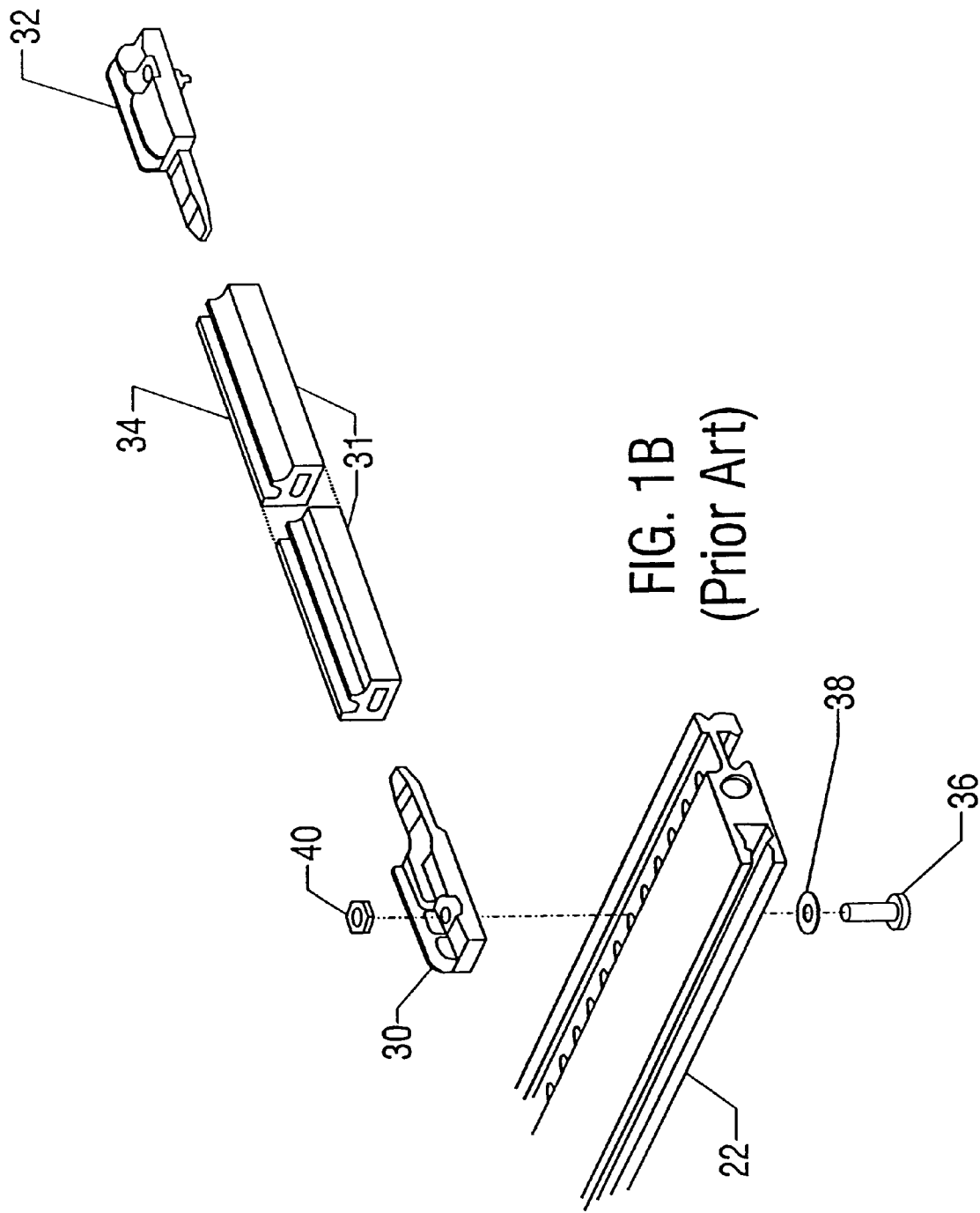
FIG. 1B illustrates the use of typical hardware to attach a card guide in an extruded rail design.
Figure 1C:
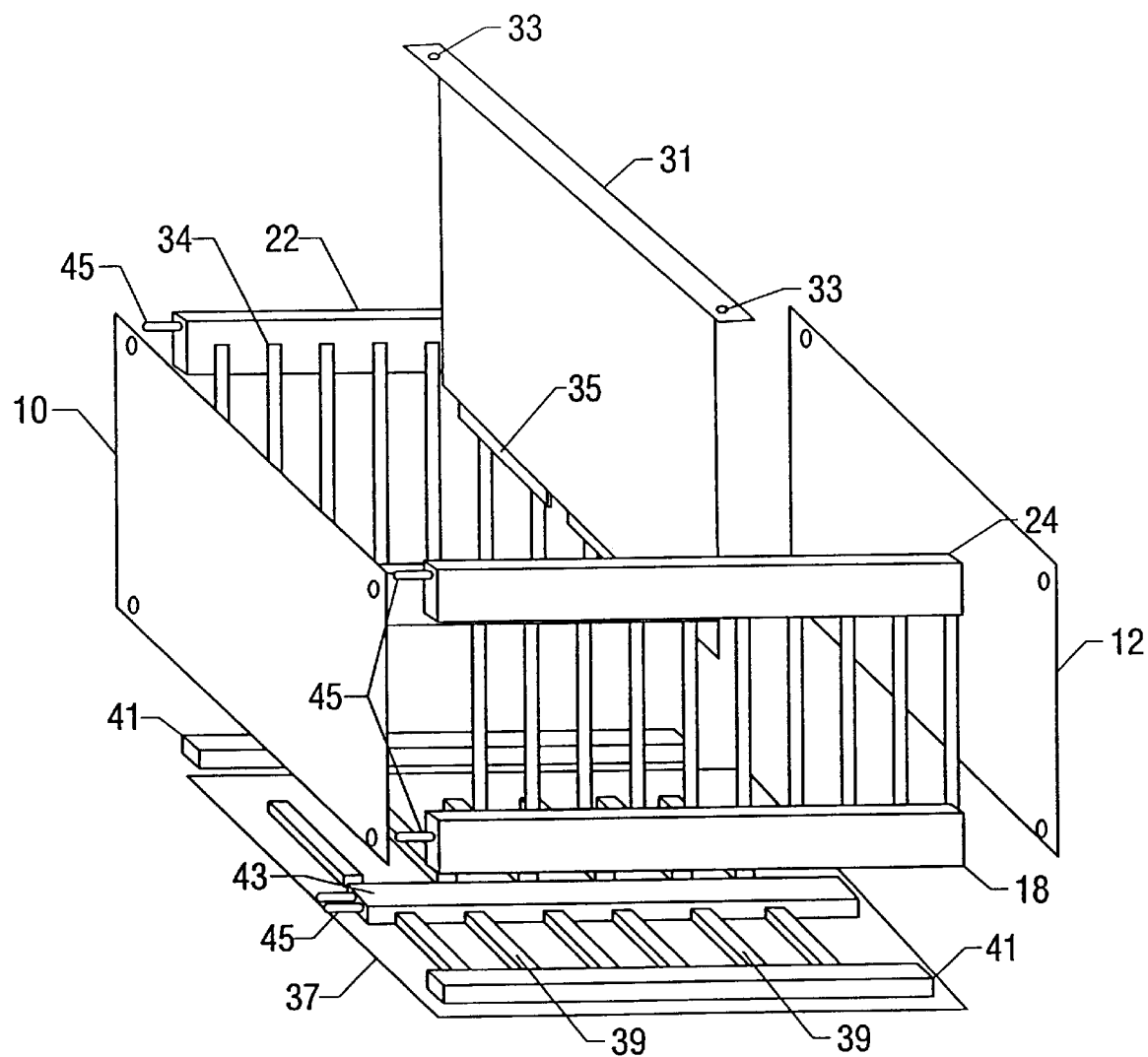
FIG. 1C is an exploded view of a typical extruded cardcage design with extruded rails, card guides, insulating strips, nutrails, backplane, and a circuit card.
Figure 4:
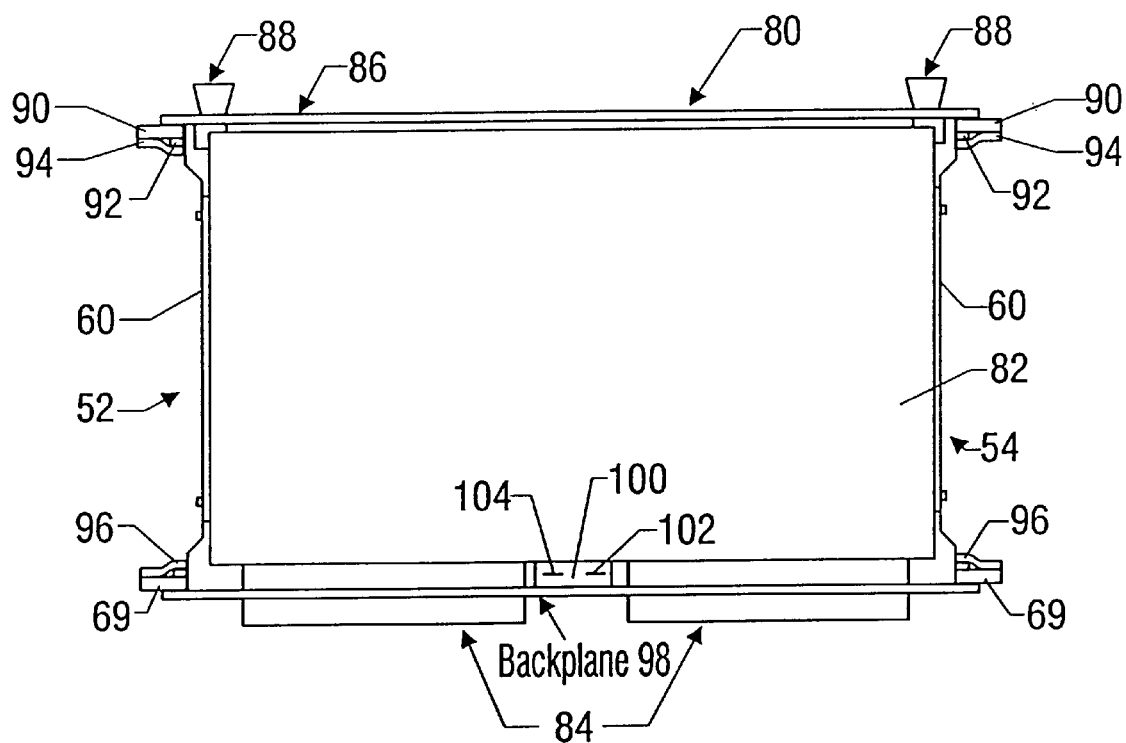
FIG. 4 illustrates a side view of a circuit card inserted into the cardcage of the present invention.

An example of a prior art cardcage, assembled using traditional assembly techniques, is illustrated in FIGS. 1A, 1B, and 1C. The illustrated cardcage is a standard VME 6U Sub-rack with a depth of 160 mm. The cardcage is primarily comprised of two end plates (10 and 12) and four extruded rails (18, 20, 22, and 24). The four extruded rails are connected to the side plates by a plurality of fasteners 26, usually screws, extending through the holes in the end plates and into the extruded rails to form the cardcage. The four extruded rails include a plurality of holes spaced along the length of the rail used for attaching card guides. Card guides 34 (FIG. 1C) extend between extruded rail 18 and extruded rail 20 to form the side of the cardcage. Similarly, card guides 34 extend between extruded rail 22 and extruded rail 24. These card guides provide support and alignment for a circuit card to be inserted into the cardcage. Additionally, the card guides 34 serve to guide a circuit card into the cardcage to engage a backplane connector as shown in FIG. 4. The spaces between the card guides 34 are designed to allow the passage of air into and out of the cardcage. The backplane may be supported by a center rear extruded rail 28 that extends between the cardcage sides (10 and 12). Angle plates 14 and 16 may be provided for rack mounting the cardcage.

FIG. 1B shows a prior card guide that could be used with the cardcage in FIG. 1A. The illustrated card guide 34 can be made to be any required length. Two end pieces 30 and 32 allow the card guide to be connected to the extruded rails. The length of the card guide 34 is determined by the number of extensions 31 placed between the end pieces 30 and 32. The card guide 34 is connected to the extruded rails, 18, 20, 22, and 24, through a hole by a screw 36, washer 38, and nut 40. In the alternative, the card guide may snap into the extruded rails.

FIG. 1C illustrates the attachment of a circuit card 31 with mounting holes 33 and card connector 35 to a backplane 37 within the cardcage. The backplane 37 includes a plurality of backplane connectors 39 based on a standard bus architecture for connecting circuit cards. The backplane 37 is connected to the cardcage using mounting screws that extend through the backplane 37 and insulating strip 41 into floating nutrails 45. The insulating strips 41 are provided to ensure that the backplane 37 is electrically isolated from the cardcage. A center extrusion rail 43 is provided in some systems to provide additional support for the backplane to prevent flexing under shock and vibration loads. A circuit card 31 is installed into the cardcage by sliding the circuit card 31 into a pair of associated card guides 34. The circuit card connector 35 engages the backplane connector 39 when fully inserted. Circuit card mounting holes 33 are provided to securely attach the circuit card to the extruded rails (22 and 24) of the cardcage.

A plurality of nutrails 45 are provided in multiple locations for retaining multiple parts in the cardcage. The nutrails are small strips with tapped mounting holes on 0.20" centers. Each of the locations provided for the nutrails 45 is part of the extrusions used to build the cardcage. Each extrusion has a slot formed into it which allows the nutrail 45 to slide from end to end, allowing alignment to be set during assembly. The nutrails 45 are used to mount the backplane to the cardcage, and to mount the front panel of the circuit card to the cardcage, thereby holding a circuit card in place after installation.

The cardcage illustrated in FIGS. 1A, 1B, and 1C provides some advantages in terms of flexibility in designing various sizes of cardcages. When building a cardcage, the cardcage extruded rails (18, 20, 22, and 24) may be cut to an appropriate size. In other words, by using cardcage extruded rails and various length card guides 34, a variety of sizes of cardcages with various heights and widths can be built. However, as previously discussed, cardcages using extruded rails and fasteners suffer from several disadvantages. In particular, these cardcage designs require a number of connections and components to build a cardcage. For example, as shown in relation to FIG. 1A, FIG. 1B, and FIG. 1C, there are 5 extruded rails; two card guides per circuit card; four screws, washers, and nuts per circuit card (shown in FIG. 1B); four or six nutrails; four insulating strips; and a backplane. Due to the amount of hardware associated with each card guide, assembly time is a significant cost. Moreover, the extruded rail design requires careful alignment of the backplane, the cardcage, and the card guide rails. The failure to properly align the components may cause circuit cards to improperly connect to the backplane when inserted to the cardcage. In addition, the machining, drilling, tapping, and assembly of the various components is expensive and time consuming.

Figure 2:
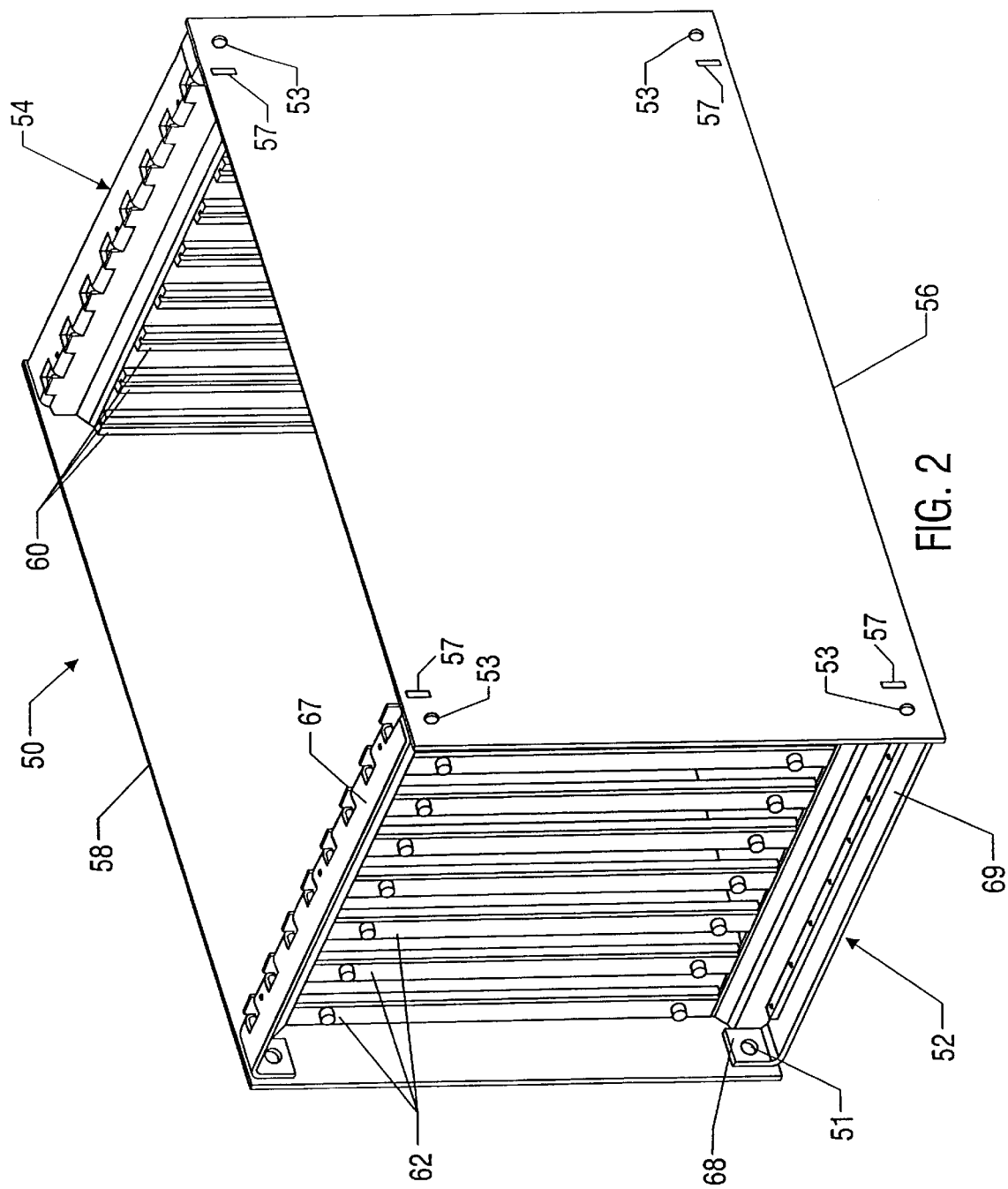
FIG. 2 schematically illustrates the cardcage of the present invention.

FIG. 2 illustrates an embodiment of the present invention that overcomes the problems associated with prior cardcages. The illustrated embodiment is a VME 6U-160 mm cardcage, which incorporates the present invention. Although the invention is illustrated using this particular size cardcage, it should readily be understood that other sizes and types of cardcages may be built without departing from the spirit and scope of the present invention. For example, cardcages may be built to support a variety of types of buses (e.g., VME and VXI standard buses), card heights (e.g., 3U, 6U, and 9U), card widths (e.g. 19 inches), or cardcage depths (e.g., 160 mm, 220 mm, and 400 mm).

Figure 3A:
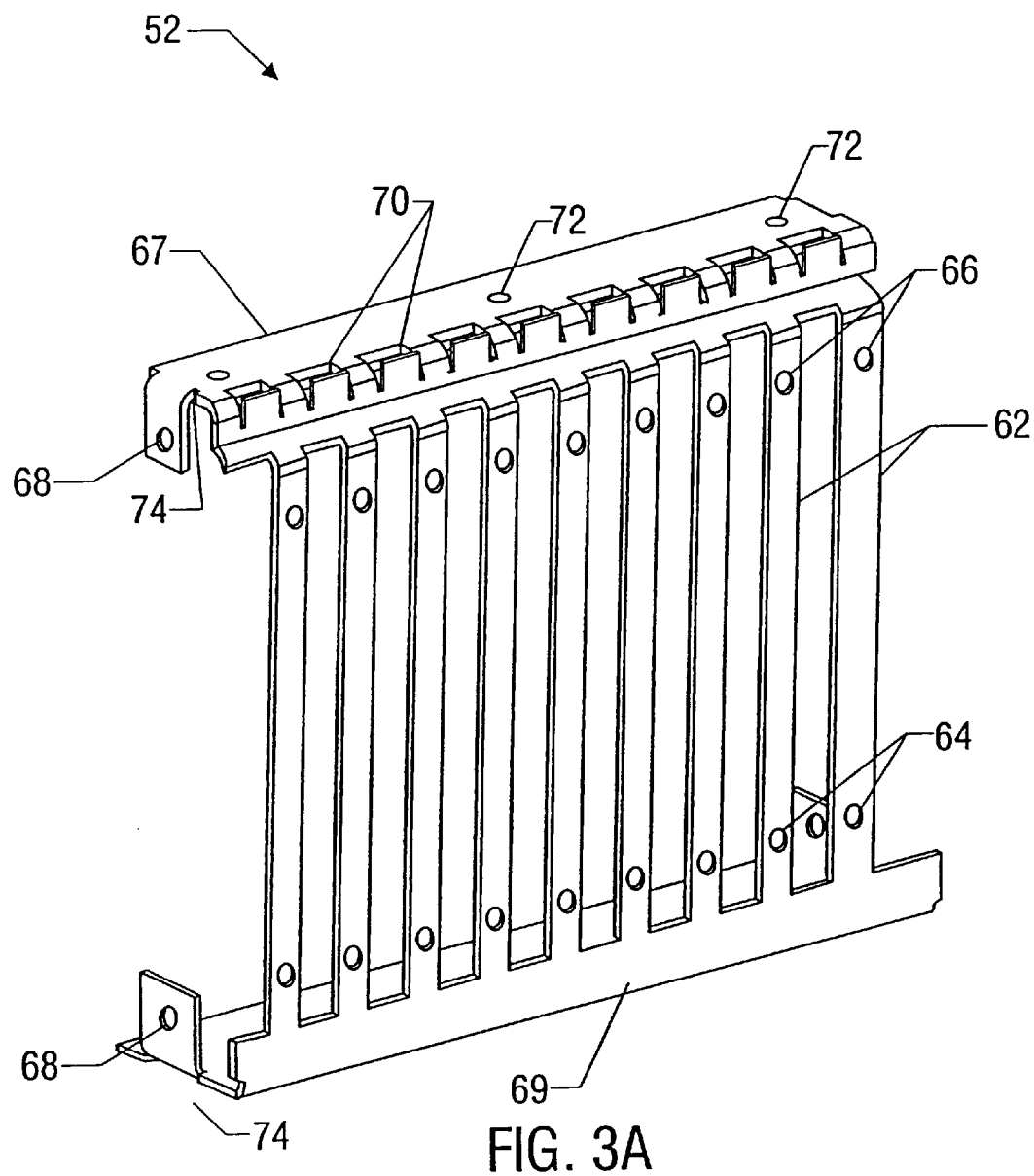
FIGS. 3A–3C schematically illustrate the formed cardcage ends of the present invention.

The cardcage 50 includes two cardcage sides, 52 and 54, and two end plates, 56 and 58. Each cardcage side, 52 and 54, is connected via a suitable connection means, including screws, bolts, or other acceptable connection, to sheets 56 and 58 through flanges 68. The flanges 68 align with flange connection points 53 on the sheets 56 and 58. Cardcage sides 52 and 54 also include alignment tabs 74 (FIG. 3A). The alignment tabs 74 mate with slots 57 on sheets 56 and 58. By providing cardcage ends as an integral unit with alignment tabs 74 and flanges 68, the deficiencies with regard to alignment associated with extruded metal designs is substantially eliminated. Moreover, the use of fasteners is substantially reduced, resulting in reduced assembly time and increased shock and vibration tolerance because of the elimination of a number of attachments.

In an embodiment, the cardcage sides, 52 and 54, are constructed using precision punched and formed aluminum construction instead of extrusions. These manufacturing procedures are well known in the art and result in a manufacturing process that ensures close tolerances between card guides, circuit card mounting features, and the cardcage backplane mounting features. It should readily be understood, however, that other metals and other techniques may be used to form the integral cardcage sides without departing from the spirit and scope of the present invention.

Each cardcage side includes a plurality of card guide attachment locations 62 that are laterally spaced and integral with a pair of flanges 67 and 69. The card guide attachment locations may be conformed to receive and retain card guides 60, which may be inserted into the integral cardcage sides, 52 and 54. Normally, the cardcage attachment locations 62 are integral with the flanges (67 and 69).

The card guides 60 provide support and guidance for circuit cards while being inserted into the cardcage. In an embodiment, the card guides are made of nylon and are snapped in through holes punched into the guide attachment locations 62 of the integral cardcage sides, 52 and 54. These card guides 60 are readily available from Bivar. Although the present invention is illustrated using card guides from Bivar, it should be understood that any suitable card guides may be used without departing from the spirit and scope of the present invention.

In an alternative embodiment, the card guides may be formed as part of the process used to form the card guide attachment locations. A numerically controlled punch tool can be used to form card guides instead of using off-the-shelf card guides. In this embodiment, no additional card guides need to be inserted into the formed cardcage side, thereby further reducing the required assembly.

Figure 3B:
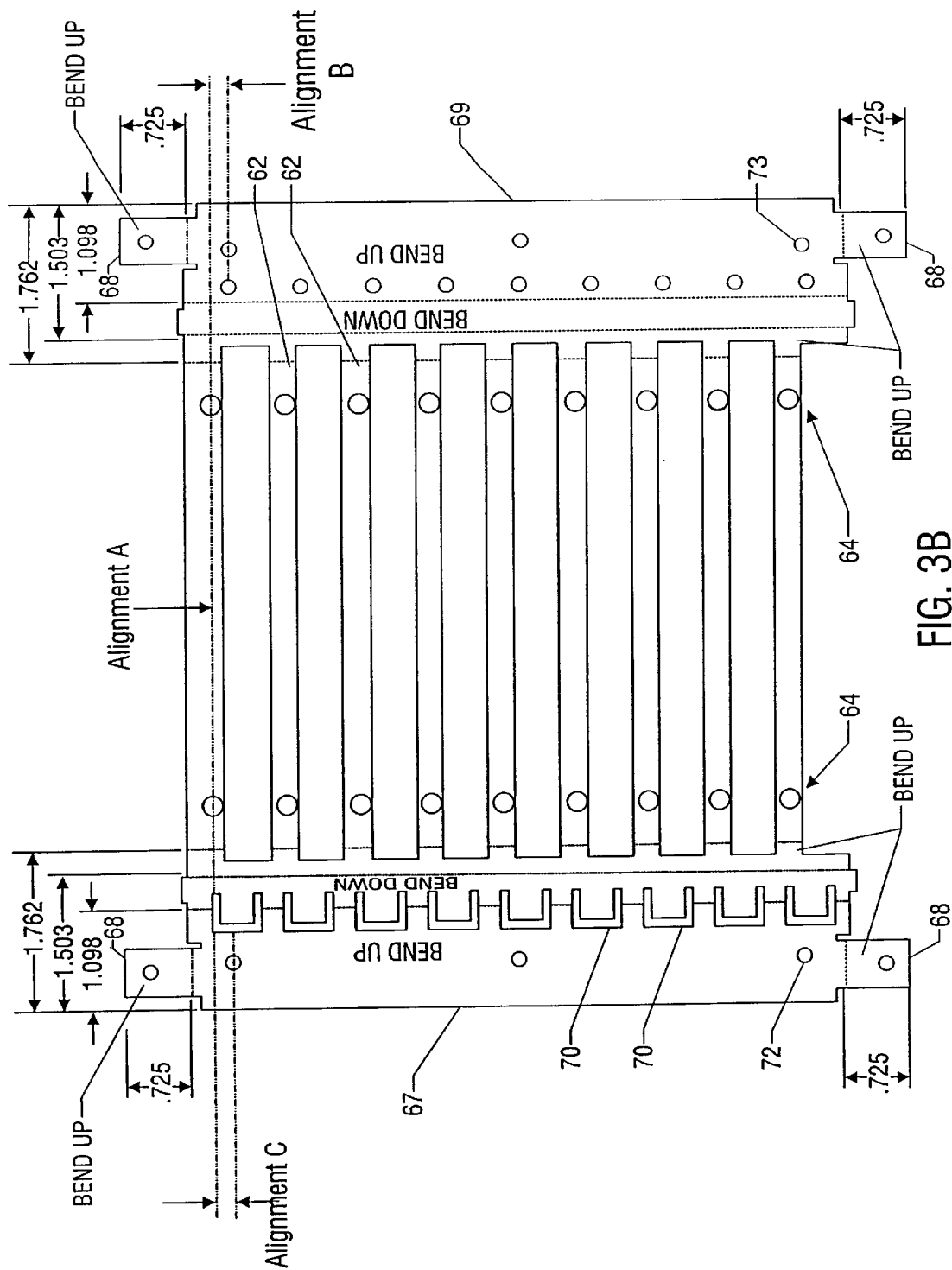
Figure 3C:
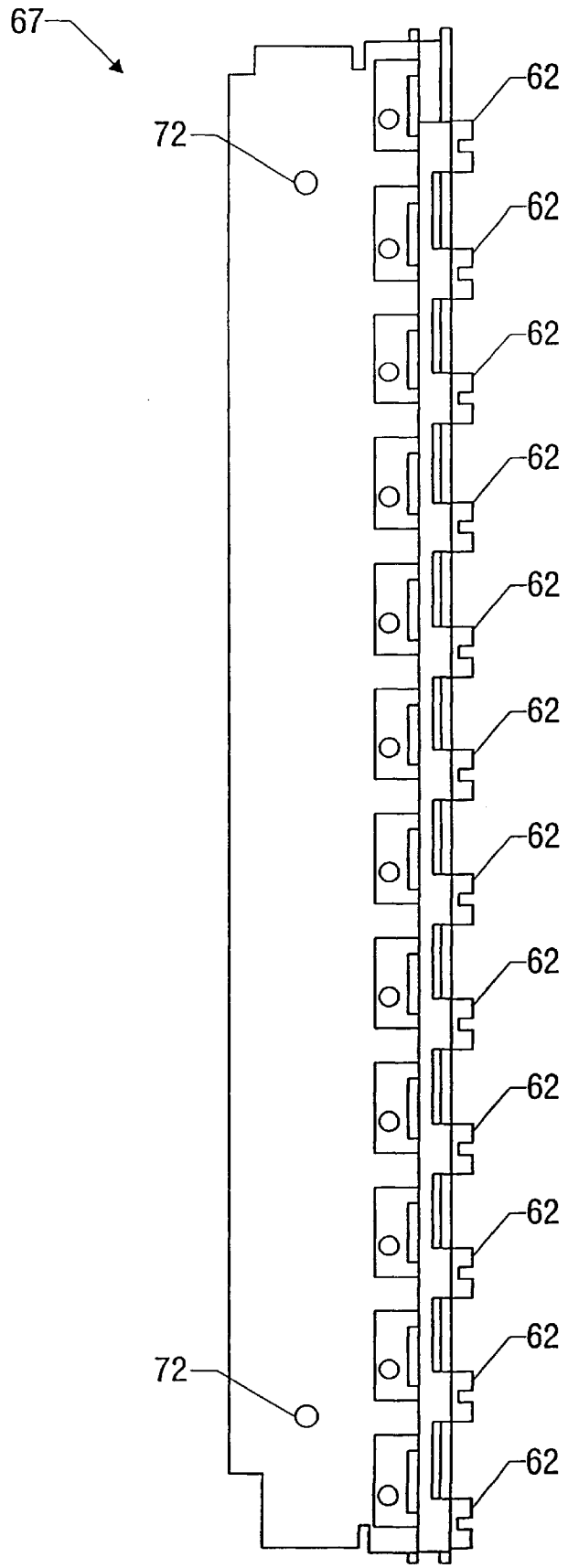

FIGS. 3A–3C schematically illustrates an embodiment of a cardcage side 52 of the present invention. The cardcage side 52 is punched from a single piece of material. FIG. 3B shows the cardcage side 52 in its punched and unformed condition. After the cardcage side is punched to form a flat sheet as shown in FIG. 3B, the flat sheet is bent to the desired shape using a Numerical Controlled Brake. The resulting cardcage side 52, illustrated in FIG. 3A and FIG. 3C, includes a plurality of guide attachment locations 62. Each card guide attachment location 62 includes a top opening 66 and a bottom opening 64 for receiving a card guide. The card guide attachment locations 62 extend between a first flange 67 and a second flange 69. In an embodiment, the first and second flanges are formed at a 90 degree angle from the guide attachment locations 62. The first flange 67 includes a plurality of holes 72 spaced along the flange for attaching devices to retain circuit cards. The second flange 69 includes a plurality of holes 73 (FIG. 3B) spaced along the flange 69 for attachment of a backplane. The first and second flange may also contain a plurality of holes spaced along the flange for attachment of airflow guides or ducts as shown in FIGS.

7C, 8, and 9A. In another embodiment, these features may be formed as part of the cardcage side.

In an embodiment, at both ends of each flange 67 and 69, additional flanges 68 are formed perpendicular to the first flange 67 and the second flange 69, and parallel to guide attachment locations 62. Flanges 68 permit the cardcage sides, 52 and 54, to be connected to sheets, 56 and 58, to form the cardcage of the present invention. Additionally, tabs 74 may be included for alignment purposes of the cardcage sides when mated with slots 57 on the sheets 56 and 58.

In the present invention, the cardcage side is formed at equal and opposite angles (45 degree) near the first flange 67 and the second flange 69. This formation is pre-formed to meet the space requirements for hardware given in the specification that this embodiment is designed for.

The cardcage sides 52 and 54 also includes a plurality of flat tabs 70 at the front edge of front rail 67. These tabs provide the surface for the circuit card to stop on when fully inserted into the cardcage. The rectangular openings allow access to the threaded insert for attaching the front panel of the card.

FIG. 4 provides a side view of a circuit card 80 inserted into an embodiment of a cardcage of the present invention. The circuit card 80 may be any well-known circuit card assembly that includes a circuit board 82 connected to backplane connectors 84. The front of the typical circuit card includes a circuit card front panel 86 and handles 88 for inserting and removing the circuit card.

In operation, the circuit card 80 is inserted into the cardcage via card guides 60, which are inserted into cardcage sides 52 and 54. Card guides 60 provide alignment between the circuit card 80 and a backplane 98. A backplane stiffener 100 may also be included between sheets 56 and 58 to provide additional torsional stiffness for inserting circuit card assembly 80 into backplane 98. The backplane stiffener 100 is attached using nutrails 102 and 104.

Figure 5A:
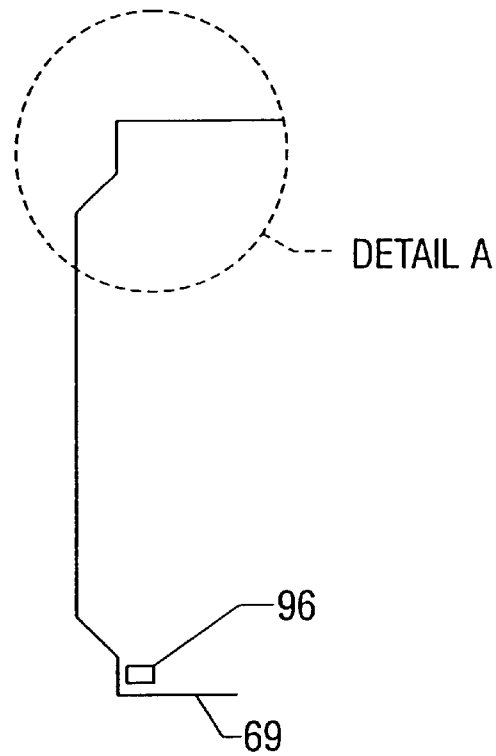
FIGS. 5A–5B schematically illustrate an embodiment of the present invention in which a circuit card is attached using nutrails.
Figure 5B:
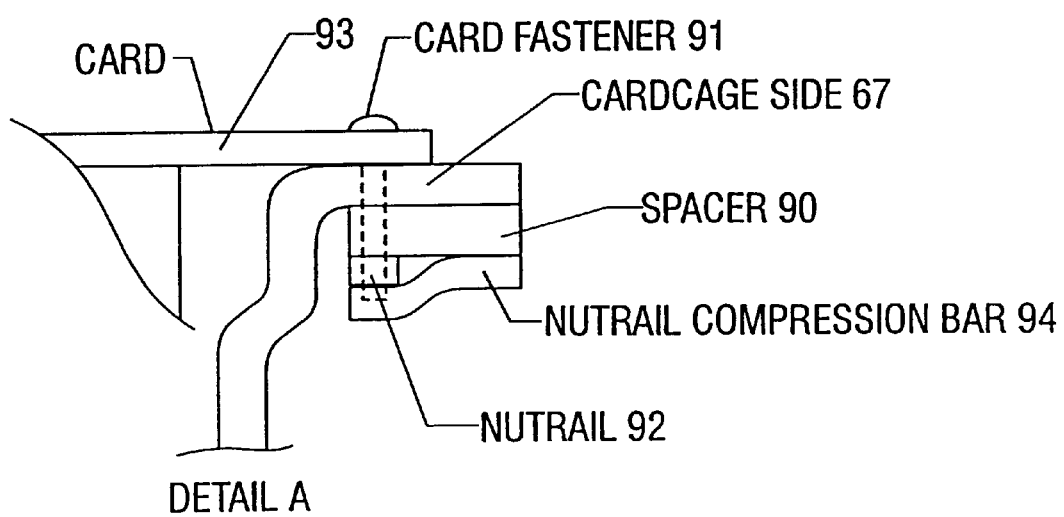

FIGS. 5A and 5B illustrate one method for connecting a circuit card to the cardcage side of the present invention. In particular, FIG. 5B provides a detailed view of connecting a nutrail 92 to the cardcage side using a nutrail compression bar 94, and a spacer 90. Comparably, FIG. SA shows the backplane attachment which is handled though the use of a nutrail 96 which is attached to the second flange 69 by some suitable means, including screws or rivets, through mounting holes which have been punched to a close tolerance for alignment purposes.

The embodiment illustrated in FIGS. 5A and 5B is for connecting VME 6U-160 mm cards. Once again, it should be understood that the illustrated method for connecting may be used with any size cards. In the illustrated embodiment, a card fastener 91 extends through the circuit card front panel 93, the spacer 90, and the cardcage side flange 67, and screws into the nutrail 92. The spacer 90 is used to lower the nutrail 92 below the card fastener 91. Since this fastener 91 is typically captive and protrudes below the card panel prior to insertion, the spacer 90 ensures that the captive fastener 91 does not hit the nutrail 92 prior to full card insertion. A nutrail compression bar 94 holds the nutrail 92 into place prior to card installation. Fasteners are used to join the nutrail compression bar 94 and the spacer 90 to the cardcage flange 67.

Although the present invention is illustrated using the above method for connecting the circuit card, it should be understood that other connection methods may be used without departing from the spirit and scope of the present invention.

Figure 6A:
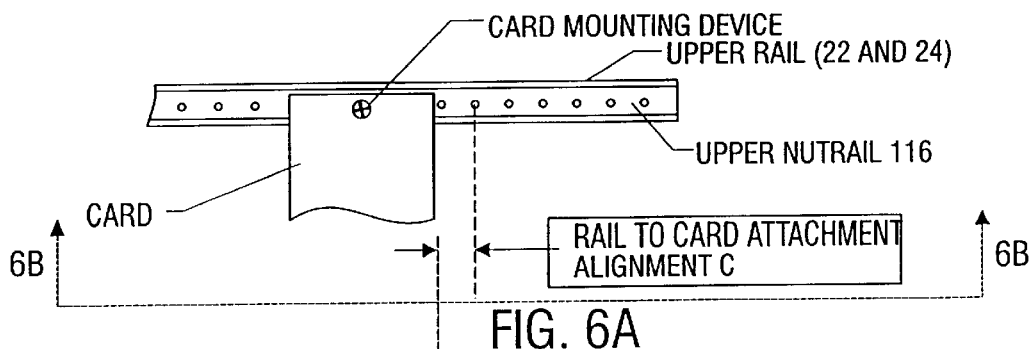
FIGS. 6A–6C illustrate three views of a circuit card installation showing the alignment required between the circuit card, card guide, and backplane.
Figure 6B:
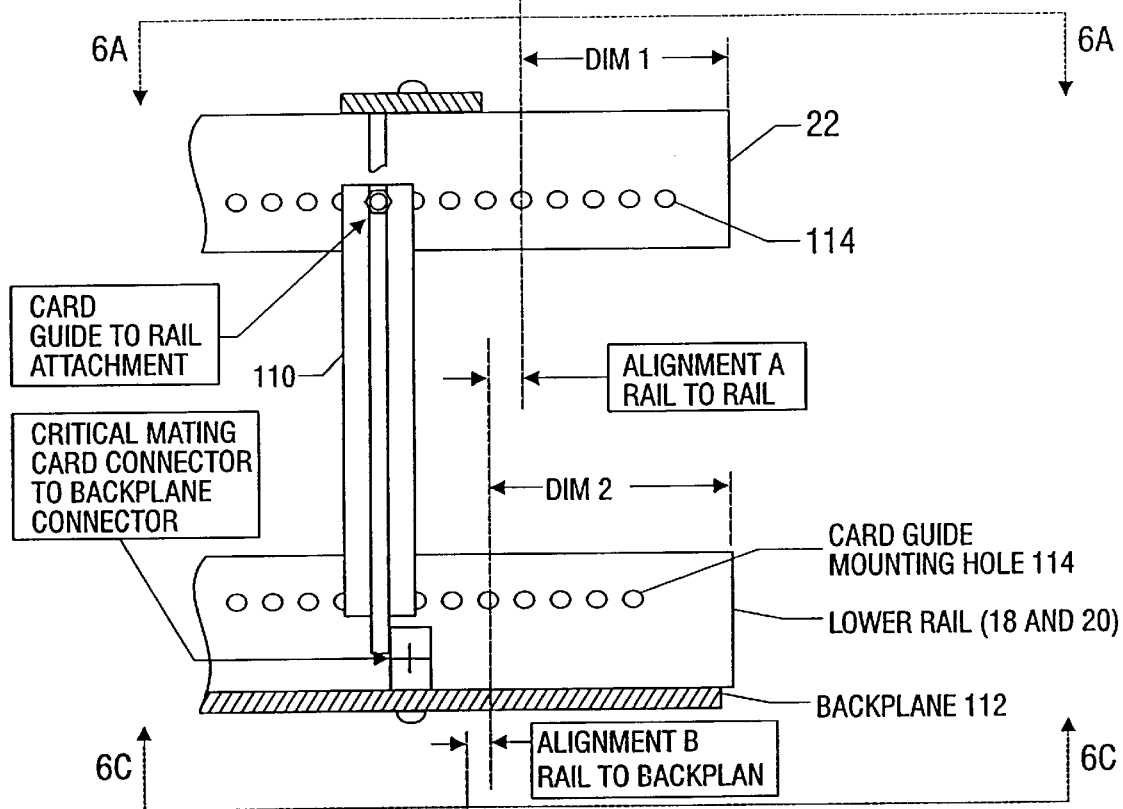
Figure 6C:
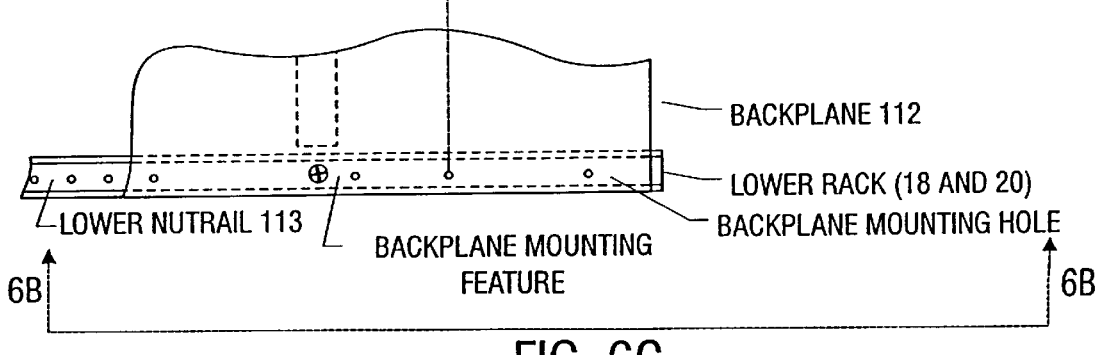

The alignment of the backplane to the cards is an important improvement made by the present invention. FIGS. 6A–C shows the alignment problems that must be overcome when using an extruded rail cardcage design. Misalignment can occur with the machining of the ends of the rails as referred to in FIGS. 6A–6C. These extrusion rails must be machined to the same length within a tight tolerance. Both upper and lower entrance rails and upper and lower exit rails must be exact mirror images of each other with respect to the location of the mounting features for the card guides. Any misalignment of card guide mounting locations from upper rail 22 and 24 to lower rail 18 and 20 (Alignment A) at the entrance or the exit will inhibit mating of circuit card connectors to backplane connectors due to the card guide 110 not being perpendicular to the backplane 112 (FIG. 6B). The inaccuracies in cutting the extruded rails to length and in cutting the extruded rails at the proper location relative to the card guide mounting holes 114 (illustrated in FIG. 6B as DIM1 and DIM2) are due to random tolerance errors, errors in setup and fixturing the rails to be cut, and measurement errors in the cutting process. These inaccuracies add up in all extruded rail cardcage designs and cause poor repeatability in alignment.

In the present invention, the mounting holes (62 and 64 in FIG. 3A) for the card guides 60 and the alignment between card guide attachment locations 64 are all punched into a single sheet of metal relative to the mounting holes for the front panels and the backplane. Then, the metal is formed using a CNC brake machine. This procedure eliminates the tolerance build up that occurs in the machining process of the extruded rails. The only misalignment possible is the repeatability of the CNC punch (typically +/−0.004 inches)

In the extruded rail design in FIG. 6B, the card guide 110 is installed by snapping a plastic tab into an oval type slot and groove in the upper and lower extrusion rails (18, 20, 22, and 24). The card guide may then be screwed to the extrusion to hold it in place. The card guides are typically mounted to the rails using screws, washers, and nuts through clearance holes in both the rail and the card guide. This process inherently adds misalignment due to the fact that all fasteners allow misalignment except for press fit pins and countersunk fasteners mating with a tapped thread form.

With the present invention, the card guides 60 (FIG. 2) are press fit into punched holes 64 and 66, which are located with high accuracy by the CNC punch machine relative to the mounting holes 72 and 73 for the front panels and the backplane. This technique provides virtually no misalignment of the card guide to the intended hole location.

The typical extruded rail cardcage design, as shown in FIG. 6C, includes lower extruded rails with grooves extruded along their length that allows a floating nutrail 113 to be slid into place for attachment of the backplane 112. Due to the non-fixed location of the nutrails 113 used for backplane attachment, the location of the backplane 112 is not fixed on one axis and, therefore, must be aligned (Alignment B). The alignment of the backplane 112 to the card is a manual alignment that must be performed during assembly for each backplane installed relative to its respective cards. This alignment procedure requires a precisely made alignment tool and is critical for the mating of the card to the cardcage and the card to the backplane. This alignment process can only correct misalignment between the backplane 112 and the associated extruded rail. It cannot correct misalignment from extruded rail to extruded rail (Alignment A), which causes a circuit card, when inserted, to approach the backplane at a non-perpendicular angle.

In the present invention, the nutrails 96 used for mounting the backplane are fixed to the cardcage side second flange 69 with countersunk screws into the tapped threads of the nutrail 96 to prevent misalignment. Additionally, the clearance holes through the second flange 69 are sized close to the backplane mounting screws, adding extra assurances that the backplane is fixed to the correct location and structurally held into place. In the present invention, alignment between mounting holes on the flanges, as shown in FIG. 3B, is assured due to the accuracy in the manufacturing processes previously mentioned and no manual alignment is required.

Referring to FIG. 6A, the typical extruded rail cardcage design uses extruded upper rails 22 and 24 with grooves extruded along their length that allows a floating nutrail 116 to be slid into place for attachment of the cards. Due to the non-fixed location of the nutrails 116 used for card attachment, the location of the threads in the nutrail used to attach a circuit card is not fixed on one axis and, therefore, must also be properly aligned (Alignment C).

In the present invention, the nutrails 92 (FIGS. 4, 5A, and 5B) used for mounting the circuit cards are fixed to the cardcage side first flange 67 and aligned via close tolerance alignment holes installed during assembly. The nutrail compression bar 94 ensures the nutrail 92 is fixed. This method prevents misalignment of the card fastener to the nutrail threads. In an alternate embodiment, the nutrail 92 may be attached to the cardcage first flange 67 with countersunk screws similar to the backplane nutrail 96.

Figures 1, 7A:
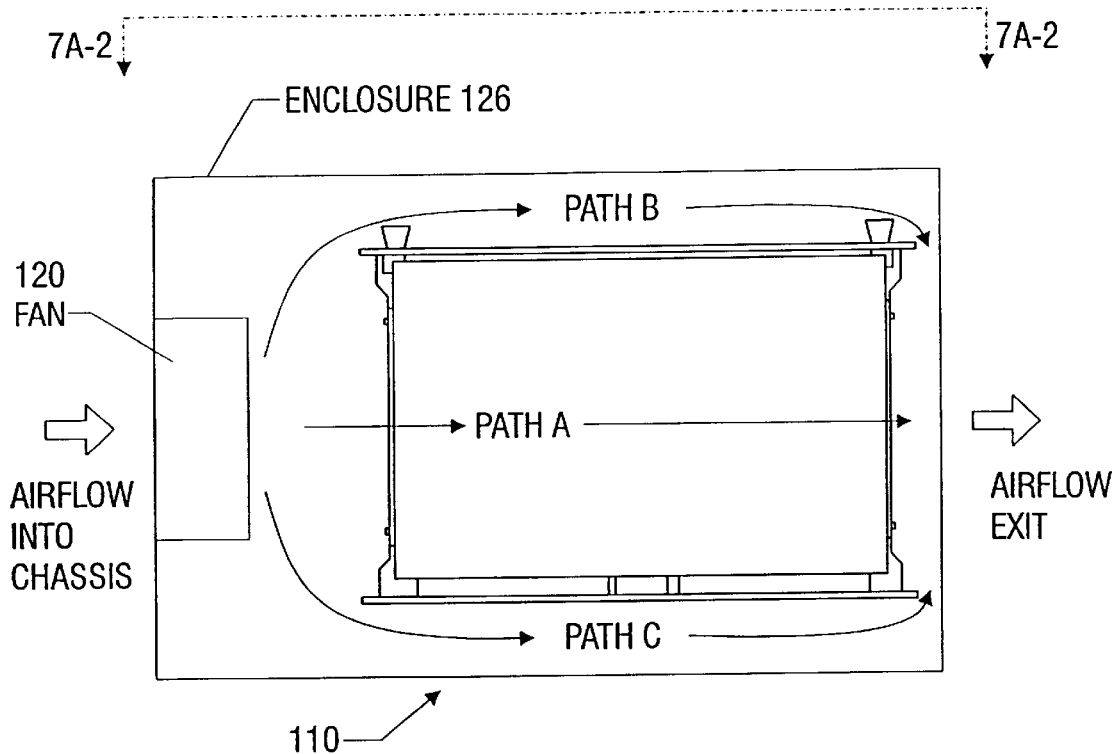
FIG. 7A illustrates the airflow in a side view of an extruded rail cardcage with the circuit card, extruded rails, a backplane, and no ducting to direct the airflow.
Figures 2, 7A:
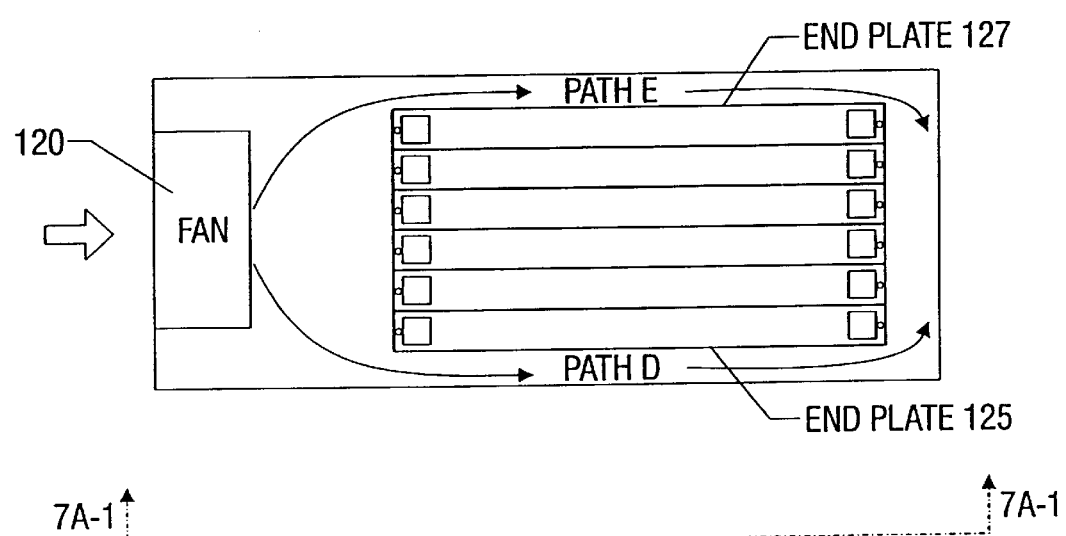

FIG. 7A illustrates the side view of a prior art enclosure 126 containing a cardcage built using extruded rails with a fan 120, a circuit card 122, and a backplane 124. The airflow paths defined in this figure are typically what is seen in an extruded rail system. The preferred path for the airflow is path A, but as the figure shows, paths B and C are unrestricted areas and a large portion of the airflow may pass through these paths. Additional paths, D and E, allow air to avoid the cardcage by passing on the near side of the near end plate 125 or on the far side of the far end plate 127.

FIG. 7A illustrates another problem associated with extruded rail designs. Prior cardcage sides built using extruded rails have a smaller airflow opening due to the size of the extrusions and the method of connecting extruded rails to card guides. The result is reduced height of the airflow opening into and out of the cardcage. On average, the height of typical cardcage openings for VME 6U-160 mm cards are approximately 70% of the card height (DIM3 on FIG. 7B). A specific example is the extruded rail system for VME 6U-160 mm cards made by SCHROFF INC. This example uses extruded rail part numbers 30819-332,30819-333, and card guide part number 60817-053. The size of this airflow opening for this system is 4.2 inches by 0.6 inches. The height of a VME card is 6.293 inches. The airflow opening for this SCHROFF cardcage system is 67% of the card height. The converse is that 33% of the height available for airflow to enter and exit the cardcage is blocked and as a result, the airflow will attempt to flow through less restrictive paths (Paths B and C).

Figure 7B:
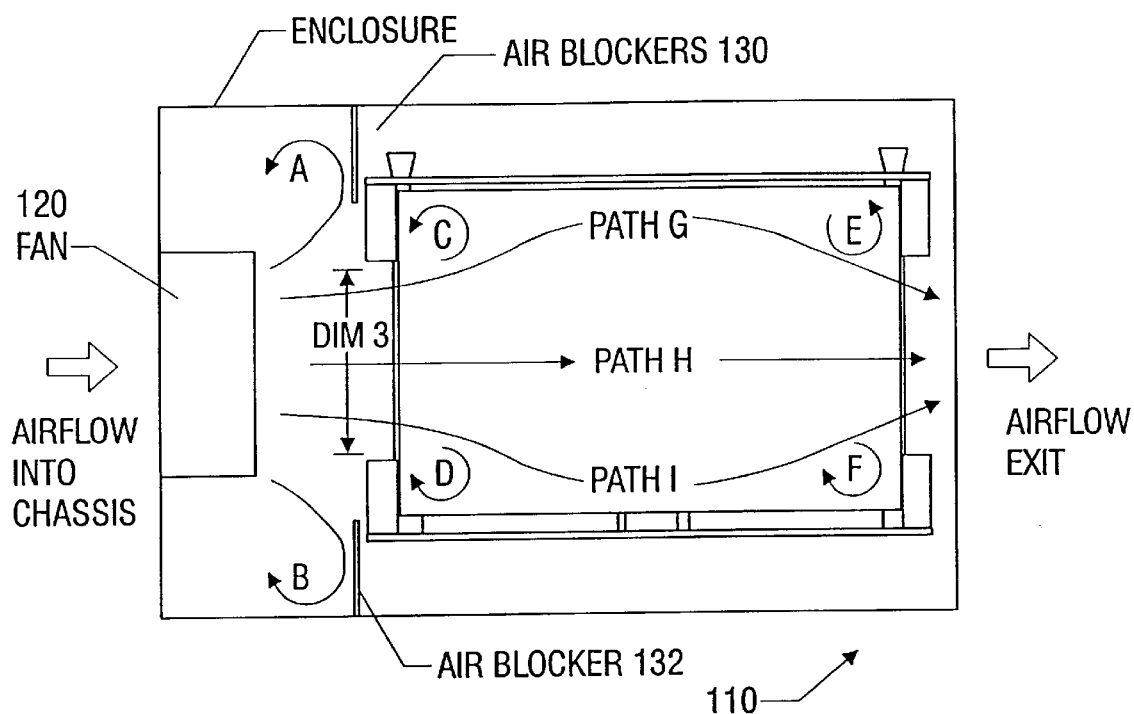
FIG. 7B illustrates the airflow in a side view of a cardcage in an extruded rail system with a circuit card, extruded rails, a backplane, and air blockers above and below the cardcage.

FIG. 7B illustrates the airflow in a side view of the cardcage in FIG. 7A, but with air blockers 130 and 132 for preventing airflow in undesired Paths B and C. The reduced inlet area on extruded rail designs creates places which can have low velocity air flow (or "dead" spots) at the recirculation loops located in the four corners of the card (locations C, D, E, and F). The reduced inlet area along with the typical airflow blockers 130 and 132 also creates locations (locations A and B) where turbulence can be created prior to the cardcage entrance. These recirculation areas (locations A and B) disturb the smooth flow of air through the cardcage.

This turbulence outside the cardcage increases the pressure drop in the airflow path, reduces total airflow, and disturbs the smooth transition of air into the cardcage. These undesirable affects cause great concern with the increase of heat densities on state-of-the-art circuit cards and the increased packaging density of a circuit card's surface area with components requiring airflow. The recirculation loops shown can cause an increase in the local air temperature of 10 degrees C or more. Since the cooling of the devices on circuit cards is based directly on temperature and velocity, any device located in the indicated recirculation areas will be considerably hotter and have a reduced life compared to devices in non-recirculation and low velocity areas.

Figure 7C:
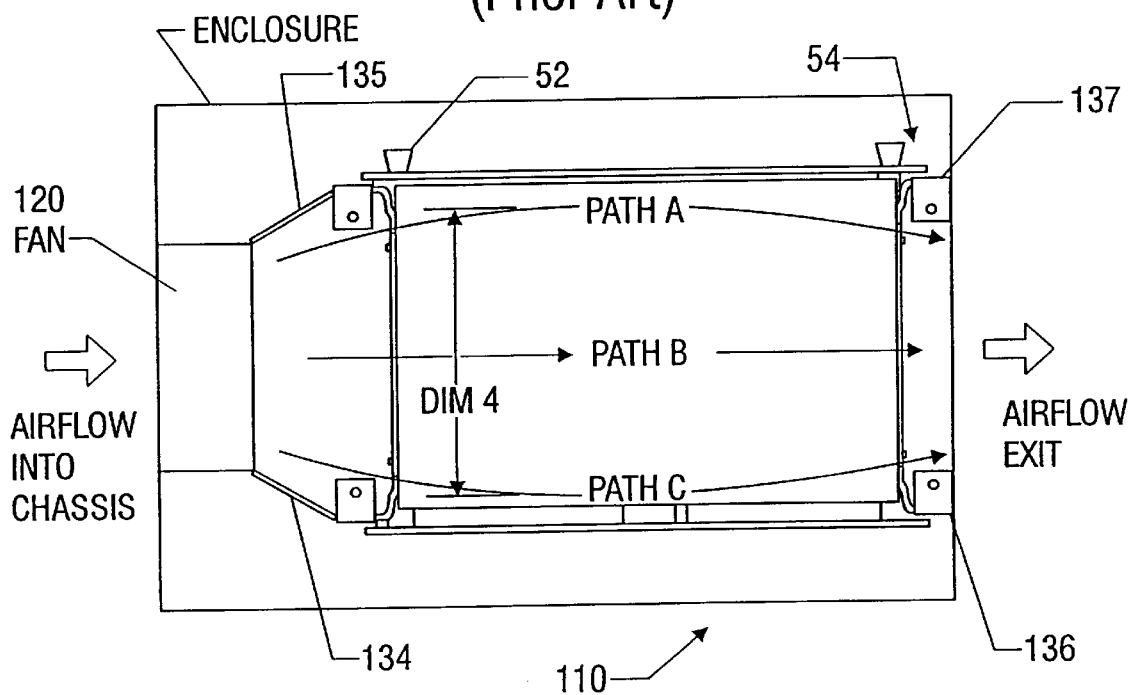
FIG. 7C illustrates the airflow in a side view of a cardcage with the cardcage sides of the present invention with a circuit card, cardcage inlet and exit ducts, and a backplane.

The present invention, by providing an integral cardcage side that changes the attachment method for card guides, circuit cards, and backplanes, provides a larger opening for air from an airflow source to enter and exit the cardcage. The larger opening permits greater airflow and therefore greater cooling ability than prior cardcages. On average, the integral cardcage sides of the present invention provide openings of approximately 90% of the card height. FIG. 7C shows the new opening height (DIM 4).

In the illustrated example, the opening on the present invention as used in a cardcage with VME 6U-160 mm cards, is 5.65 inches by 0.5 inches, which is 90% of the card height. This larger opening reduces or eliminates the recirculation and low velocity areas within a cardcage caused by blocked airflow in the extruded rail system.

FIG. 7C describes another embodiment of the present invention in which additional improvements in cooling are attained. In particular, FIG. 7C shows a side view of circuit card enclosure 10 with cardcage sides 52 and 54. The cardcage sides are connected as previously discussed in relation to FIG. 3. In addition, a fan 120 is provided for providing airflow across circuit cards within the cardcage. In an embodiment, the fan is a axial flow fan providing airflow above 0 cubic feet per minute. A typical axial flow fan is approximately 4.5 inch by 4.5 inch by 1.5 inch and is readily available from Rotron. It should be understood, however, that any source of airflow, including centrifugal blowers, may be used. The cardcage side further includes airflow entrance guides 134 and 135, which are angled from the fan 120 to the cardcage side 52 of the present invention. The angled airflow entrance guides 134 and 135 direct airflow toward the desired area without the problems associate with traditional blockers.

Figure 8:
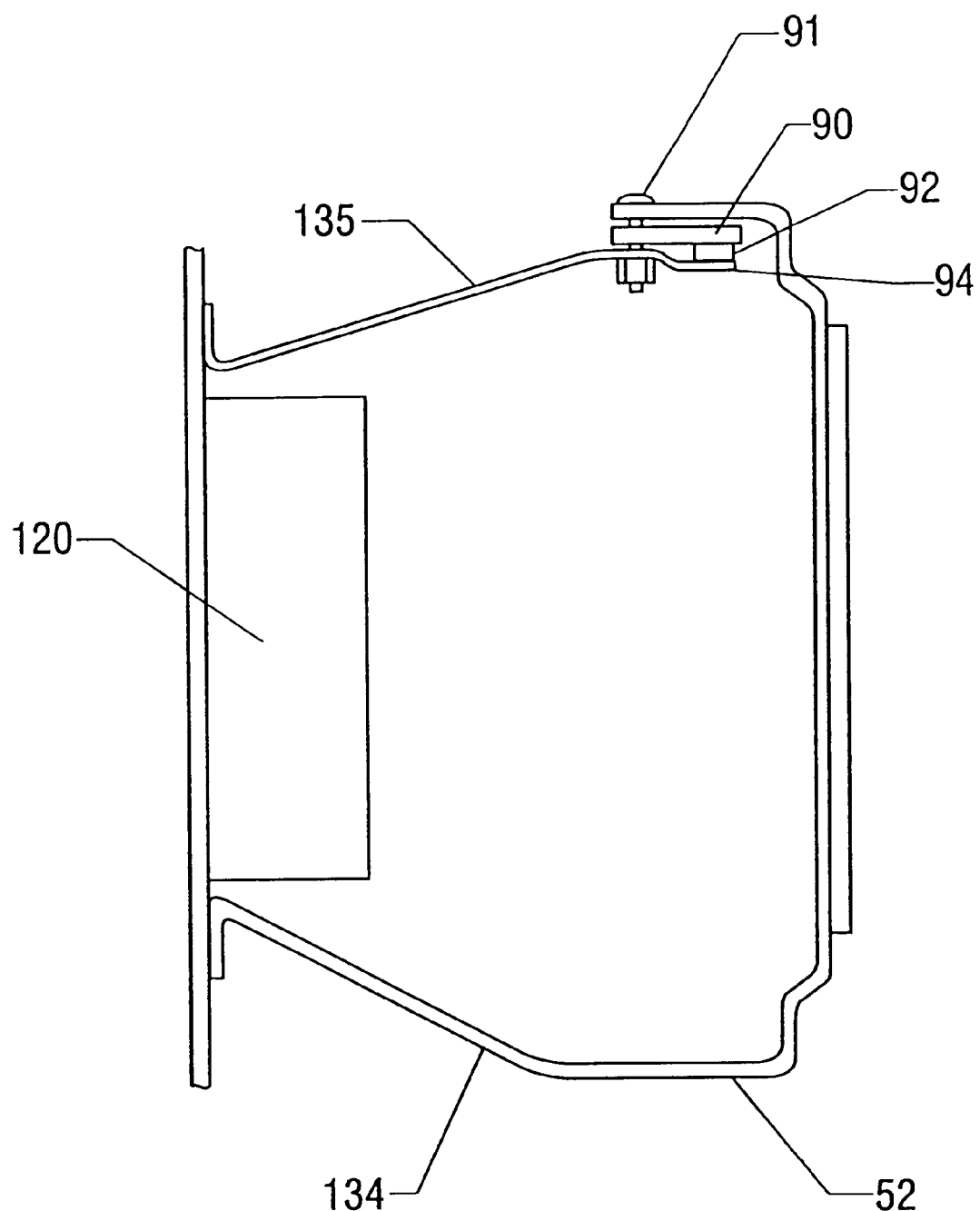
FIG. 8 illustrates an entrance airflow guide of the present invention.

FIG. 8 schematically illustrates an embodiment of the airflow entrance guides 134 and 135 with the cardcage side 52 according to the present invention. The air provided by the fan 120 is diverted toward circuit cards placed in the cardcage by integral airflow entrance guides 134 and 135. The airflow entrance guides 134 and 135 prevent airflow from going outside the area desired to be cooled. Instead, the airflow entrance guides 134 and 135 divert air towards the circuit cards, thereby providing improved cooling. By replacing the traditional air blockers 130 and 132 (FIG. 7B) with the angled airflow entrance guides, the recirculation effects outside the cardcage may be substantially reduced or eliminated. In the illustrated embodiment, the airflow entrance guides 134 and 135 may be attached by a fastener to card cage side 52 by a fastener 91 and spacer 90. In the alternative, the airflow entrance guides may be integral with the cardcage side.

As illustrated in FIG. 7C, further improvements are provided by including airflow exit guides (also referred to as ducts) 136 and 137. Airflow exit guides ensure that airflow from the fan 120 exits the cardcage rather than re-circulating within the cardcage. It is an important aspect of the invention to eliminate these re-circulation effects and provide a more uniform airflow across circuit cards. The smooth transition airflow entrance and exit guides shown in FIG. 7C are integral with the cardcage sides 52 and 54. In the shown embodiments, the exit guides (or ducts) 136 and 137 are an extended first and second flange. At the entrance, the entrance guides (or ducts) 134 and 135 are made as one part with the cardcage side. The upper entrance duct 135 is made as one part with the nutrail compression bar 94. These re-circulation effects, along with other methods for providing an improved airflow in a cardcage, are discussed more fully in copending application Ser No. 09/097,892, entitled "A Method and Apparatus for controlling Airflow," which was filed on the same day as the present application and is incorporated herein by reference.

Figure 9A:
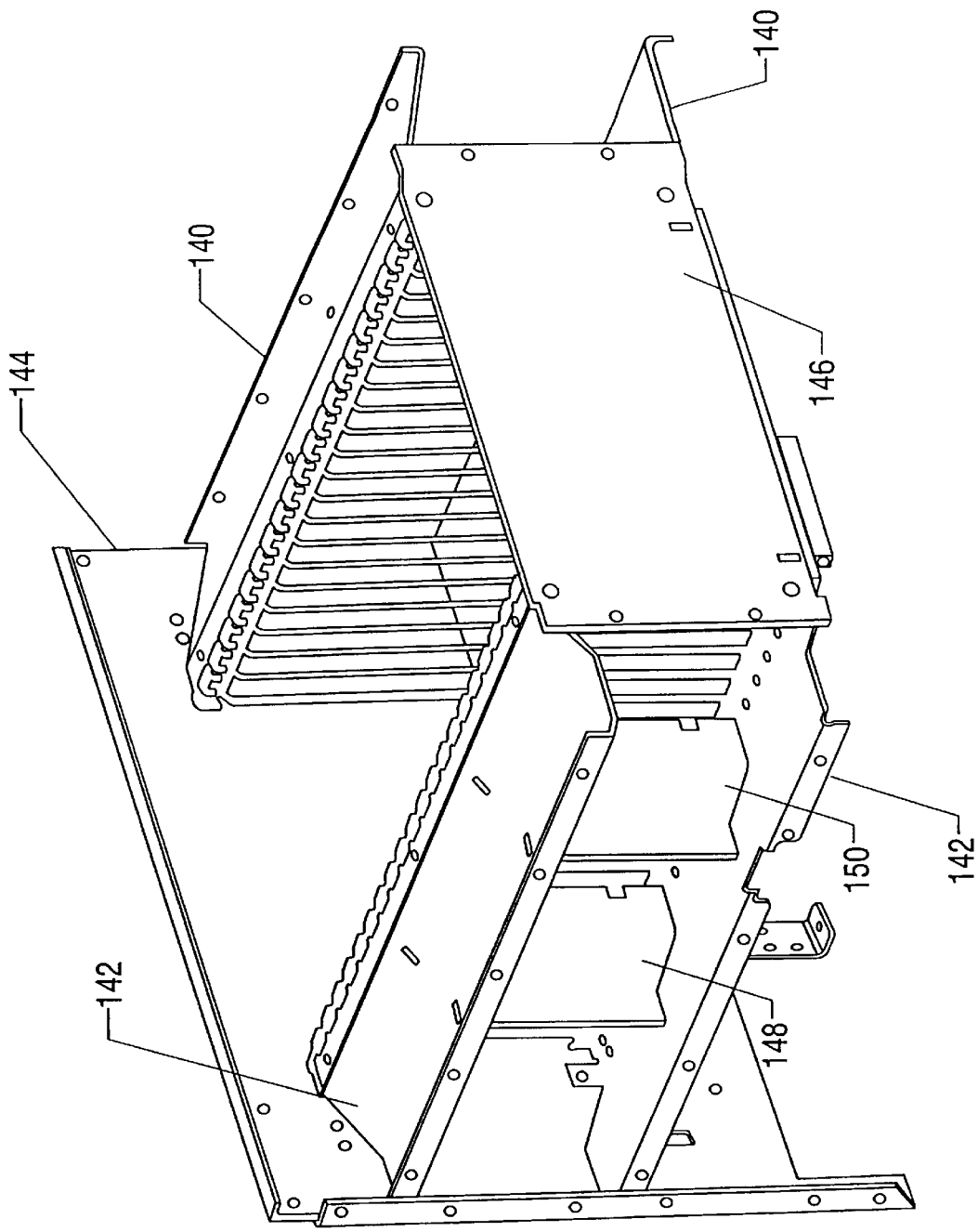
FIG. 9A is a top-front-right isometric view of an embodiment of the present invention showing a cardcage, dividers for separating airflow from multiple fans, and an integral duct to force the airflow to pass through the cardcage. s

FIG. 9A schematically illustrates a top-front-right isometric view of an embodiment of the present invention used in a specific application. Integral exit ducts 140 and inlet ducts 142 are shown attached to the cardcage. These integral ducts are used to prevent the airflow from passing above and below the cardcage. The end plates 144 and 146 shown in this embodiment are of two different varieties. On the left side of the cardcage is the side wall of the chassis 144, which extends from the front to the back of the complete unit. On the right side is a smaller end plate panel 146 that is used as an extension to connect the cardcage to the right side of the chassis. Both of these panels are used to bound the airflow within the circuit card area.

Fan divider plates 148 and 150 are also used to prevent the interaction of airflow from multiple airflow sources. In the illustrated embodiment, two fan divider plates 148 and 150 are provided for use with 3 fans. The divider plates assist in removing the recirculation effects caused by placing fans side-by-side in a cardcage. The airflow out of a typical axial fan comes out in a spiral pattern. The interaction that occurs when multiple fans are mounted in close proximity to each other may be detrimental to the overall airflow path in a cardcage. Therefore, the fan divider plates 148 and 150 of the present invention prevent these detrimental effects by separating the airflow from each fan and directing it through the cardcage.

Figure 9B:
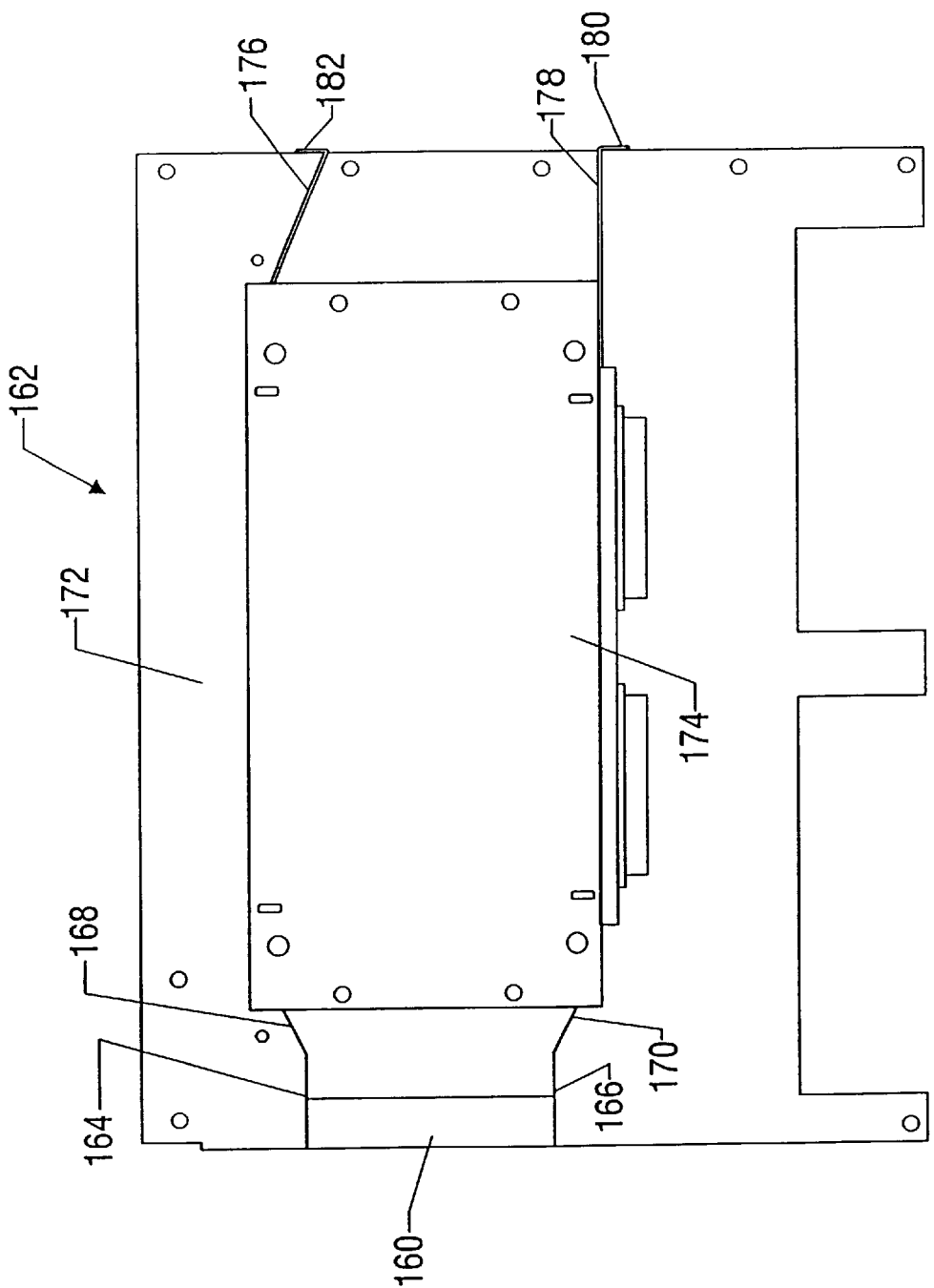
FIG. 9B is a side view of an embodiment of the present invention showing a fan, cardcage, inlet ducts to direct and bound the airflow, and exit ducts to direct the airflow out of the system.

FIG. 9B illustrates a right side view of another embodiment of the present invention. In particular, FIG. 9B shows a fan 160 at the front of the unit 162, integral cardcage inlet ducts 164 and 166 with flanges 168 and 170 above and below the fan to bound the airflow, a large left side panel 172, a small right side panel 174, and integral exit ducts 176 and 178 with flanges 180 and 182 to direct the airflow out of the system. The cardcage sides are connected as previously discussed in relation to FIG. 3. The fan 160 is used to provide airflow across the card assemblies within the cardcage. In an embodiment, the fan 160 is a axial flow fan providing airflow.

Figure 10:
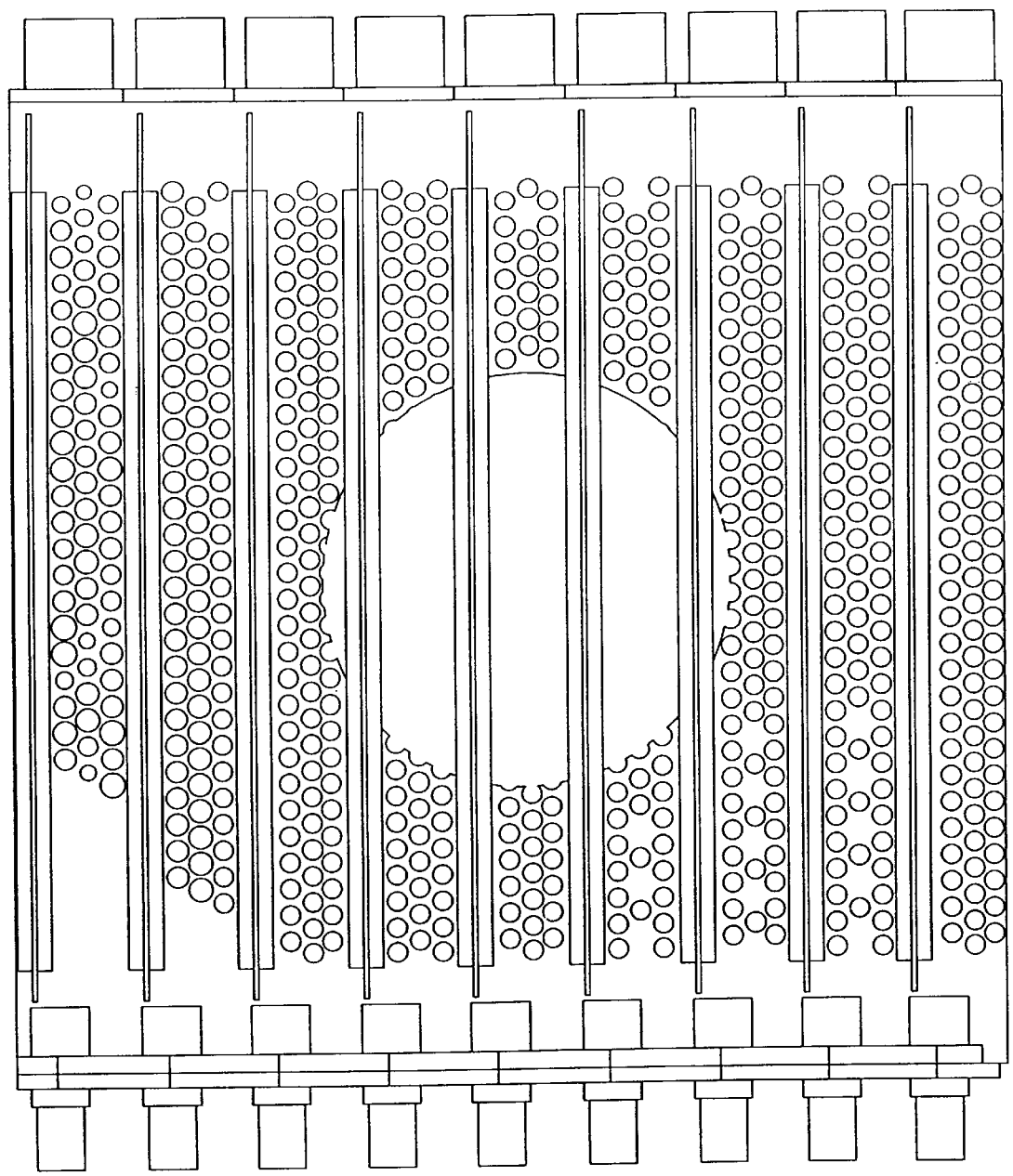
FIG. 10 illustrates the incorporation of airflow diverters into the present invention.

FIG. 10 schematically illustrates the incorporation of airflow manipulation techniques, as shown in co-pending application Ser. No. 09/097,892, with the present invention. This figure shows the integral modification of the air inlet areas on the side plate. These modifications are made to adjust the airflow as it enters a cardcage. Modifications can be made to: increase airflow in a particular region of a card, even the airflow across the entire card, or stop the flow of air in part or all of a particular card slot. The use of these techniques may reduce the total volumetric airflow through a cardcage, but the distribution throughout the cardcage is usually more critical. With the present invention, these features can be integrally formed into the cardcage side with very little cost impact. With this technique, there is no assembly time or assembly hardware required. Although the present invention incorporates these features into the side of the cardcage, it should be understood that multiple pieces may be used without departing from the spirit and scope of the present invention.

All of the methods and/or apparatus disclosed and claimed herein can be made and executed without undue experimentation in light of the present disclosure. While the devices and methods of this invention have been described in terms of specific embodiments, it will be apparent to those of skill in the art that variations may be applied to the methods and/or apparatus and in the steps or in the sequence of steps of the method described herein without departing from the concept, spirit, and scope of the invention. Therefore, all such substitutions and modifications apparent to those skilled in the art are deemed to be within the spirit, scope, and concept of the invention as defined by the appended claims.

What is claimed is:

1. A method for producing a cardcage side to be attached to end sheets of a cardcage, the cardcage side for supporting circuit cards, comprising:

forming in a flat piece of material a plurality of elongated and spaced apart guide attachment locations;

forming from the flat piece of material a first supporting flange located at one end of the plurality of spaced apart guide attachment locations;

forming from the flat piece of material a second supporting flange located at the end of the plurality of spaced apart guide attachment locations opposite from the first support flange; and forming at each end of the first and second supporting flanges additional flanges for attaching the guide attachment locations to end sheets to provide a cardcage.

2. The method for producing a cardcage side of claim 1 further comprising forming a plurality of tabs in the first supporting flange to provide a stop for circuit cards in the cardcage.

3. The method for producing a cardcage side of claim 1 further comprising attaching card guides to one or more of the plurality of guide attachment locations.

4. The method for producing a cardcage side of claim 1 further comprising forming a plurality of openings in the first supporting flange for attaching circuit card holders thereto.

5. The method for producing a cardcage side of claim 1 further comprising forming in each of the plurality of guide attachment locations openings for receiving a card guide.

6. The method for producing a cardcage side of claim 1 wherein forming the first supporting flange and the second supporting flange comprises forming the first and second supporting flanges at a 90° angle to the guide attachment locations.

7. The method for producing a cardcage side of claim 1, further comprising forming one or more alignment tabs in the first and second supporting flanges to provide alignment of the guide attachment locations with the end sheets.

8. The method for producing a cardcage side of claim 1, further comprising forming first and second airflow entrance guides integral with the cardcage.

9. The method for producing a cardcage side of claim 1, further comprising forming first and second airflow exit guides integral with the cardcage.

10. The method for producing a cardcage side of claim 1 wherein forming the plurality guide attachment locations comprises forming a plurality of elongated openings between generally parallel and spaced card guide attachment locations, the plurality of openings extending approximately 90% of the height of a circuit card.

11. A method for producing a cardcage side to be attached to end sheets of a cardcage, the cardcage side for supporting circuit cards, comprising:

forming from a flat piece of material a plurality of generally parallel and spaced card guide attachment locations;

forming between the spaced card guide attachment locations a plurality of openings for altering airflow into the cardcage;

forming from the flat piece of material a first supporting flange located at one end of the plurality of spaced apart guide attachment locations;

forming from the flat piece of material a second supporting flange located at the end of the plurality of spaced apart guide attachment locations opposite from the first supporting flange;

forming at each end of the first and second supporting flanges additional flanges for attaching the guide attachment locations to end sheets to provide a cardcage; and attaching card guides to one or more of the plurality of guide attachment locations.

12. The method for producing a cardcage side of claim 11 further comprising forming a plurality of tabs in the first supporting flange to provide a stop for circuit cards in the cardcage.

13. The method for producing a cardcage side of claim 12 further comprising forming a plurality of openings in the first supporting flange for attaching circuit cardholders.

14. The method for producing a cardcage side of claim 13 further comprising forming in each of the plurality of guide attachment locations openings for receiving a card guide.

15. The method for producing a cardcage side of claim 11 wherein forming the first supporting flange and the second supporting flange comprises forming the first and second supporting flanges at a 900 angle to the guide attachment locations.

16. The method for producing a cardcage side of claim 11, further comprising forming one or more alignment tabs in the first and second supporting flanges to provide alignment of the guide attachment locations with the end sheets.

17. The method for producing a cardcage side of claim 1, further comprising forming first and second airflow entrance guides integral with the cardcage.

18. The method for producing a cardcage side of claim 11, further comprising forming first and second airflow exit guides integral with the cardcage.

* * * * *

UNITED STATES PATENT AND TRADEMARK OFFICE
CERTIFICATE OF CORRECTION

PATENT NO.     : 6,230,541 B1
DATED          : May 15, 2001
INVENTOR(S)    : Robert H. Mimlitch, III et al.

It is certified that error appears in the above-identified patent and that said Letters Patent is hereby corrected as shown below:

Column 7,
Line 42, after "comparably", delete "Fig. SA", and insert -- Fig. 5A --.

Column 14,
Line 15, after "a", delete "900", and insert -- 90° --.
Line 22, after "claim", delete "1", and insert -- 11 --.

Signed and Sealed this

Twelfth Day of November, 2002

Attest:

JAMES E. ROGAN
Attesting Officer        Director of the United States Patent and Trademark Office

UNITED STATES PATENT AND TRADEMARK OFFICE
CERTIFICATE OF CORRECTION

PATENT NO.     : 6,230,541 B1
DATED          : May 15, 2001
INVENTOR(S)    : Robert H. Mimlitch, III et al.

It is certified that error appears in the above-identified patent and that said Letters Patent is hereby corrected as shown below:

<u>Title page,</u>
Item [62], after "now" delete "abandoned" and insert -- U.S. Patent No. 6,128,187 granted October 3, 2000. --

Signed and Sealed this

Tenth Day of June, 2003

JAMES E. ROGAN
*Director of the United States Patent and Trademark Office*